(12) United States Patent
Van Der Schaar et al.

(10) Patent No.: US 8,064,056 B2
(45) Date of Patent: *Nov. 22, 2011

(54) SUBSTRATE USED IN A METHOD AND APPARATUS FOR ANGULAR-RESOLVED SPECTROSCOPIC LITHOGRAPHY CHARACTERIZATION

(75) Inventors: Maurits Van Der Schaar, Veldhoven (NL); Arie Jeffrey Den Boef, Waalre (NL); Everhardus Cornelis Mos, Best (NL); Stefan Carolus Jacobus Antonius Keij, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/010,424

(22) Filed: Jan. 20, 2011

(65) Prior Publication Data

US 2011/0122496 A1 May 26, 2011

Related U.S. Application Data

(62) Division of application No. 11/455,942, filed on Jun. 20, 2006, now Pat. No. 7,898,662.

(51) Int. Cl.
*G01B 11/00* (2006.01)
(52) U.S. Cl. ..................................................... 356/401
(58) Field of Classification Search .......... 356/399–401; 257/797; 438/401
See application file for complete search history.

(56) References Cited

U.S. PATENT DOCUMENTS

| | | | |
|---|---|---|---|
| 4,200,395 A | | 4/1980 | Smith et al. |
| 5,017,514 A | | 5/1991 | Nishimoto |
| 5,521,036 A | * | 5/1996 | Iwamoto et al. ................ 430/22 |
| 5,703,692 A | | 12/1997 | McNeil et al. |
| 5,721,619 A | * | 2/1998 | Hiruma et al. ................ 356/401 |
| 5,805,290 A | * | 9/1998 | Ausschnitt et al. ........... 356/401 |
| 5,880,838 A | | 3/1999 | Marx et al. |
| 5,963,329 A | | 10/1999 | Conrad et al. |
| 5,966,201 A | | 10/1999 | Shiraishi et al. |
| 6,150,231 A | | 11/2000 | Muller et al. |
| 6,239,031 B1 | | 5/2001 | Kepler et al. |
| 6,356,343 B1 | | 3/2002 | Shiraishi et al. |
| 6,388,341 B2 | | 5/2002 | Arai et al. |
| 6,486,954 B1 | | 11/2002 | Mieher et al. |
| 6,521,900 B1 | | 2/2003 | Hirayanagi |
| 6,573,975 B2 | | 6/2003 | Govil et al. |
| 6,608,690 B2 | | 8/2003 | Niu et al. |
| 6,699,624 B2 | | 3/2004 | Niu et al. |
| 6,704,661 B1 | | 3/2004 | Opsal et al. |

(Continued)

FOREIGN PATENT DOCUMENTS

JP 53-137673 A 12/1978

(Continued)

OTHER PUBLICATIONS

English Abstract of Japanese Patent Publication No. JP 63-153818 A published Jun. 27, 1988, 1 pages.

(Continued)

*Primary Examiner* — Tarifur Chowdhury
*Assistant Examiner* — Michael P Lapage
(74) *Attorney, Agent, or Firm* — Sterne, Kessler, Goldstein & Fox P.L.L.C.

(57) ABSTRACT

A substrate includes an overlay target. The overlay target can include two superposed layers. Each of the two superposed layers includes two gratings with a different pitch from each other.

9 Claims, 4 Drawing Sheets

U.S. PATENT DOCUMENTS

| | | | |
|---|---|---|---|
| 6,721,691 | B2 | 4/2004 | Bao et al. |
| 6,738,138 | B2 | 5/2004 | Wei |
| 6,753,961 | B1 | 6/2004 | Norton |
| 6,768,983 | B1 | 7/2004 | Jakatdar et al. |
| 6,772,084 | B2 | 8/2004 | Bischoff et al. |
| 6,785,638 | B2 | 8/2004 | Niu et al. |
| 6,813,034 | B2 | 11/2004 | Rosencwaig et al. |
| 6,819,426 | B2 | 11/2004 | Sezginer et al. |
| 6,844,918 | B2 | 1/2005 | Koren et al. |
| 6,856,408 | B2 | 2/2005 | Raymond |
| 6,876,092 | B2 | 4/2005 | Ballarin |
| 6,919,964 | B2 | 7/2005 | Chu |
| 6,921,916 | B2 | 7/2005 | Adel et al. |
| 6,922,230 | B2 | 7/2005 | Govil et al. |
| 6,928,628 | B2 | 8/2005 | Seligson et al. |
| 6,963,389 | B2 | 11/2005 | Fukada |
| 6,972,852 | B2 | 12/2005 | Opsal et al. |
| 6,974,962 | B2 | 12/2005 | Brill et al. |
| 6,982,793 | B1 * | 1/2006 | Yang et al. .................... 356/401 |
| 6,985,618 | B2 | 1/2006 | Adel et al. |
| 6,985,793 | B2 | 1/2006 | Landers et al. |
| 6,987,572 | B2 | 1/2006 | Lakkapragada et al. |
| 6,995,831 | B2 | 2/2006 | Levasier et al. |
| 7,002,667 | B2 | 2/2006 | Levasier et al. |
| 7,046,376 | B2 | 5/2006 | Sezginer |
| 7,061,615 | B1 | 6/2006 | Lowe-Webb |
| 7,061,623 | B2 | 6/2006 | Davidson |
| 7,061,627 | B2 | 6/2006 | Opsal et al. |
| 7,068,363 | B2 | 6/2006 | Bevis et al. |
| 7,112,813 | B2 | 9/2006 | Den Boef et al. |
| 7,242,477 | B2 | 7/2007 | Mieher et al. |
| 7,259,828 | B2 | 8/2007 | Tolsma et al. |
| 7,280,212 | B2 | 10/2007 | Mieher et al. |
| 7,283,236 | B2 | 10/2007 | Presura et al. |
| 7,298,481 | B2 | 11/2007 | Mieher et al. |
| 7,317,531 | B2 | 1/2008 | Mieher et al. |
| 7,433,040 | B2 | 10/2008 | Mieher et al. |
| 7,556,898 | B2 | 7/2009 | Marokkey |
| 7,687,925 | B2 | 3/2010 | Marokkey et al. |
| 7,898,662 | B2 | 3/2011 | Van Der Schaar et al. |
| 2003/0021467 | A1 * | 1/2003 | Adel et al. .................... 382/151 |
| 2003/0160163 | A1 * | 8/2003 | Wong et al. ................. 250/237 R |
| 2004/0066496 | A1 | 4/2004 | Govil et al. |
| 2004/0119970 | A1 | 6/2004 | Dusa et al. |
| 2004/0130690 | A1 | 7/2004 | Koren et al. |
| 2005/0012928 | A1 * | 1/2005 | Sezginer et al. ............. 356/401 |
| 2005/0069790 | A1 * | 3/2005 | Gruss et al. .................... 430/22 |
| 2006/0025059 | A1 | 2/2006 | Gueorguiev et al. |
| 2006/0033921 | A1 | 2/2006 | Den Boef et al. |
| 2006/0066855 | A1 | 3/2006 | Den Boef et al. |
| 2006/0126074 | A1 | 6/2006 | Van Der Werf et al. |
| 2006/0139592 | A1 | 6/2006 | Den Boef et al. |
| 2007/0077503 | A1 * | 4/2007 | Yoo ................................ 430/22 |
| 2007/0291269 | A1 | 12/2007 | Van Der Schaar et al. |
| 2010/0091284 | A1 | 4/2010 | Mieher et al. |

FOREIGN PATENT DOCUMENTS

| | | |
|---|---|---|
| JP | 63-153818 A | 6/1988 |
| JP | 63-260045 A | 10/1988 |
| JP | 2-143544 A | 6/1990 |
| JP | 3-278513 A | 12/1991 |
| JP | 6-045225 A | 2/1994 |
| JP | 8-008156 A | 1/1996 |
| JP | 9-152309 A | 6/1997 |
| JP | 10-189443 A | 7/1998 |
| JP | 10-270346 A | 10/1998 |
| JP | 2000-012459 A | 1/2000 |
| JP | 2000-252203 A | 9/2000 |
| JP | 2001-297958 A | 10/2001 |
| JP | 2002-110507 A | 4/2002 |
| JP | 2002-359184 A | 12/2002 |
| JP | 2003-007608 A | 1/2003 |
| JP | 2003-092257 A | 3/2003 |
| JP | 2004-282017 A | 10/2004 |
| JP | 2005-216872 A | 8/2005 |
| JP | 2005-328061 A | 11/2005 |
| JP | 2006-041506 A | 2/2006 |
| JP | 2007-073970 A | 3/2007 |
| JP | 2007-096292 A | 4/2007 |
| JP | 2007-103928 A | 4/2007 |
| WO | WO 99/39376 A1 | 8/1999 |
| WO | WO 02/18871 A1 | 3/2002 |
| WO | WO 02/19415 A1 | 3/2002 |
| WO | WO 2004/053426 A1 | 6/2004 |
| WO | WO 2004/076963 A2 | 9/2004 |
| WO | WO 2004/107415 A1 | 12/2004 |
| WO | WO 2005/079498 A2 | 9/2005 |

OTHER PUBLICATIONS

English Abstract of Japanese Patent Publication No. JP 63-260045 A published Oct. 27, 1988, 1 pages.
English Abstract of Japanese Patent Publication No. JP 3-278513 A published Dec. 10, 1991, 1 pages.
English Abstract of Japanese Patent Publication No. JP 6-045225 A published Feb. 18, 1994, 1 pages.
English Abstract of Japanese Patent Publication No. JP 8-008156 A published Jan. 12, 1996, 1 pages.
English Abstract of Japanese Patent Publication No. JP 9-152309 A published Jun. 10, 1997, 1 pages.
English Abstract of Japanese Patent Publication No. JP 10-270346 A published Oct. 9, 1998, 1 pages.
English Abstract of Japanese Patent Publication No. JP 2002-110507 A published Apr. 12, 2002, 1 pages.
English Abstract of Japanese Patent Publication No. JP 2004-507901 T published Mar. 11, 2004, 1 pages.
English Abstract of Japanese Patent Publication No. JP 2004-508711 T published Mar. 18, 2004, 1 pages.
English Abstract of Japanese Patent Publication No. JP 2006-509219 T published Mar. 16, 2006, 1 pages.
English Abstract of Japanese Patent Publication No. JP 2006-518942 T published Aug. 17, 2006, 1 pages.
English Abstract of Japanese Patent Publication No. JP 2007-527531 T published Sep. 27, 2007, 1 pages.
Non-Final Rejection mailed Oct. 3, 2008 for U.S. Appl. No. 11/455,942, filed Jun. 20, 2006; 13 pages.
Final Rejection mailed Mar. 18, 2009 for U.S. Appl. No. 11/455,942, filed Jun. 20, 2006; 15 pages.
Non-Final Rejection mailed May 28, 2009 for U.S. Appl. No. 11/455,942, filed Jun. 20, 2006; 13 pages.
Final Rejection mailed Nov. 18, 2009 for U.S. Appl. No. 11/455,942, filed Jun. 20, 2006; 16 pages.
Non-Final Rejection mailed Mar. 12, 2010 for U.S. Appl. No. 11/455,942, filed Jun. 20, 2006; 16 pages.
Final Rejection mailed Aug. 24, 2010 for U.S. Appl. No. 11/455,942, filed Jun. 20, 2006; 18 pages.
Notice of Allowance mailed Oct. 28, 2010 for U.S. Appl. No. 11/455,942, filed Jun. 20, 2006; 6 pages.

* cited by examiner

SUBSTRATE USED IN A METHOD AND APPARATUS FOR ANGULAR-RESOLVED SPECTROSCOPIC LITHOGRAPHY CHARACTERIZATION

CROSS REFERENCE TO RELATED APPLICATION

This application is a Divisional of U.S. patent application Ser. No. 11/455,942, filed Jun. 20, 2006 (that issued as U.S. Pat. No. 7,898,662 on Mar. 1, 2011), which is incorporated by reference herein in its entirety.

BACKGROUND

1. Field

The present invention relates to methods of inspection usable, for example, in the manufacture of devices by lithographic techniques and to methods of manufacturing devices using lithographic techniques.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In order to determine features of the substrate, such as its alignment relative to previous exposures, a beam is reflected off the surface of the substrate, for example at an overlay target, and an image is created on a camera of the reflected beam. By comparing the properties of the beam before and after it has been reflected off the substrate, the properties of the substrate can be determined. This can be done, for example, by comparing the reflected beam with data stored in a library of known measurements associated with known substrate properties.

A property of a substrate that is monitored is the alignment of the substrate before it is exposed. A substrate will undergo several iterations of being covered in resist, exposed and processed to remove the unexposed resist. Each time a new layer of resist is applied to the substrate in preparation for exposure, the substrate must be aligned properly so that the new layer of resist is exposed in the same places as the previous layer of resist, to ensure that the resulting pattern is as sharp as possible. The method of ensuring the alignment must be precise, but to ensure throughput of the substrates is not compromised, the overlay method must also be quick.

The state of the art describes the use of overlay markers on the surface of the substrate. Each time a layer of resist is applied, an overlay marker is exposed, etched or otherwise created on the layer of resist and this overlay marker is compared with the marker on the substrate surface (or on the layer below it if the previous layer of resist has not been removed at that point). The overlay marker will often take the shape of a grating. The overlap of one grating on another is detectable using an overlay radiation beam by measuring the diffraction pattern of the beam as it is reflected from the surface of the superposed overlay markers.

However, these sorts of overlay markers detect only the relative position of one bar of a grating (i.e. the width of the pitch of the grating) with respect to the position of the bar underneath it. If the gratings are misaligned by more than the width of a grating pitch, there is no way, from the diffraction pattern, to determine this. In other words, misalignment below a certain threshold (the width of the grating pitch) can be measured, but errors over this threshold may be easily missed. Of course, large errors in alignment cause large errors in the exposed pattern and the substrates with these misexposures will often need to be discarded or completely stripped and redone.

SUMMARY

It is desirable to provide an overlay system that is capable of recognizing large overlay errors, particularly overlay errors that are larger than the pitch of the overlay marker grating.

According to an embodiment of the present invention, a substrate is provided in which the substrate includes an overlay target. The overlay target can include two superposed layers, where each of the two superposed layers includes two gratings with a different pitch from each other.

In one example, each of the two gratings can include a two-dimensional grating comprising a plurality bars with a defined width and separation. Further, each of the two gratings can include arrays of rectangular structures. Each array of rectangular structures can have a first pitch in a first direction and a second pitch in a perpendicular direction. Each of the superposed layers can include two sets of arrays, in which each set of arrays include two arrays of rectangular structures with a first array having an offset with respect to a second array in each of the sets of arrays.

Further, each of the two superposed layers can include a first set of gratings and a second set of gratings, in which the first set includes two gratings with perpendicular orientations and a first grating pitch and the second set includes two gratings with perpendicular orientations and a second grating pitch. In addition, each of the first and second sets of gratings includes four gratings: a first grating and a second grating having a parallel orientation to each other; and, a third grating and a fourth grating having a parallel orientation to each other and an orientation perpendicular to the first and second gratings, where the first and third gratings have a different offset with respect to the second and fourth gratings. The first, second, third, and fourth gratings can each have an offset.

Further features and advantages of the invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
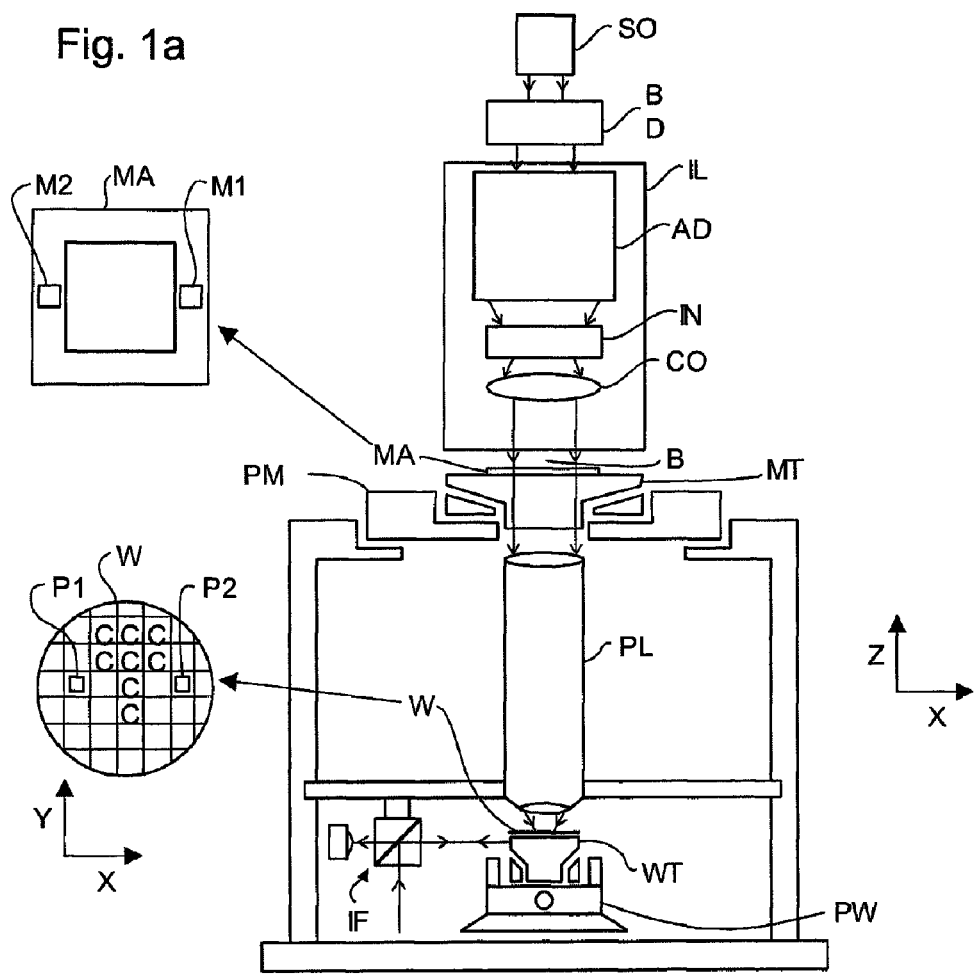
FIG. 1a depicts a lithographic apparatus according to an embodiment of the present invention.

FIG. 1a schematically depicts a lithographic apparatus. The apparatus comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT configured to hold a substrate (e.g. a resist-coated wafer) W and connected to a second positioner PW configured to accurately position the substrate in accordance with certain parameters. A projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask overlay marks M1, M2 and substrate overlay marks P1, P2. Although the substrate overlay marks as illustrated occupy dedicated target portions, they may be located in spaces between target portions (these are known as scribe-lane overlay marks). Similarly, in situations in which more than one die is provided on the mask MA, the mask overlay marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
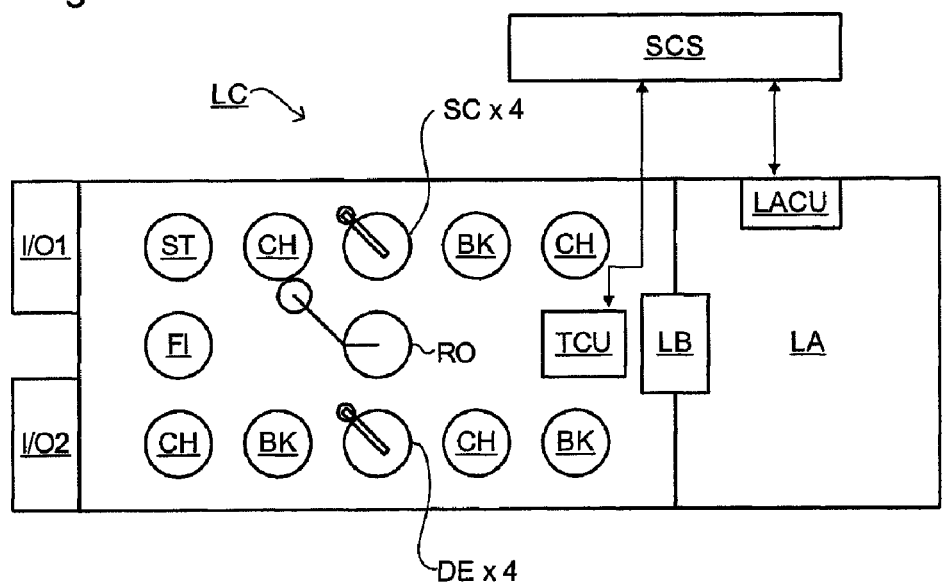
FIG. 1b depicts a lithographic cell or cluster according to an embodiment of the present invention.

As shown in FIG. 1b, the lithographic apparatus LA forms part of a lithographic cell LC, also sometimes referred to a lithocell (lithographic cell) or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus. Thus, the different apparatus can be operated to maximize throughput and processing efficiency.

As discussed above, each time a substrate undergoes an exposure process, it is desirable that the substrate is in the same orientation with respect to the exposure device as for previous exposures. This is so that the exposed patterns are in alignment in each resist layer. Errors in alignment cause errors in the exposed pattern on the substrate, causing the substrate to be less useful. The relative alignment of the substrate is therefore detected (by measuring the overlay of subsequent layers on the substrate) and any errors calculated and compensated for by the exposure apparatus or by the post-exposure processes, where possible.

An inspection apparatus separate from the lithographic apparatus (the latter containing the exposure apparatus) is used to determine the properties of the substrates, and in particular, how the properties of substrates vary from layer to layer and from substrate to substrate. The inspection apparatus is thereby also used to determine how properties of substrates vary from lithography machine to lithography machine and is therefore useful in determining how each lithography machine should be calibrated in order to produce a consistent product even with a series of apparatuses.

As mentioned above, the diffraction spectrum of superposed gratings in the scribe lane of a substrate has been used to determine the misalignment of the substrate. The scribe lane of a substrate is the area on the substrate surface that is not used for exposing the pattern and may be the lanes which will eventually be cut (e.g. by a saw) in order to separate individual integrated circuits.

The way the overlay markers in the form of gratings work is that when an overlay beam is directed on to a grating that is either in line with the grating below it or not superposed on another grating at all, a specific diffraction spectrum is created in the overlay beam being reflected off the grating. However, misalignment of the gratings causes a slight shift in the diffraction spectrum which can be seen over various diffraction orders. The larger the misalignment, the larger the change in the diffraction spectrum. The problem with the prior art lies in the fact that if a grating that is superposed on a first grating is misaligned by exactly the pitch of the grating, the diffraction spectrum will only show that the bars of the grating are aligned.

Figure 2:
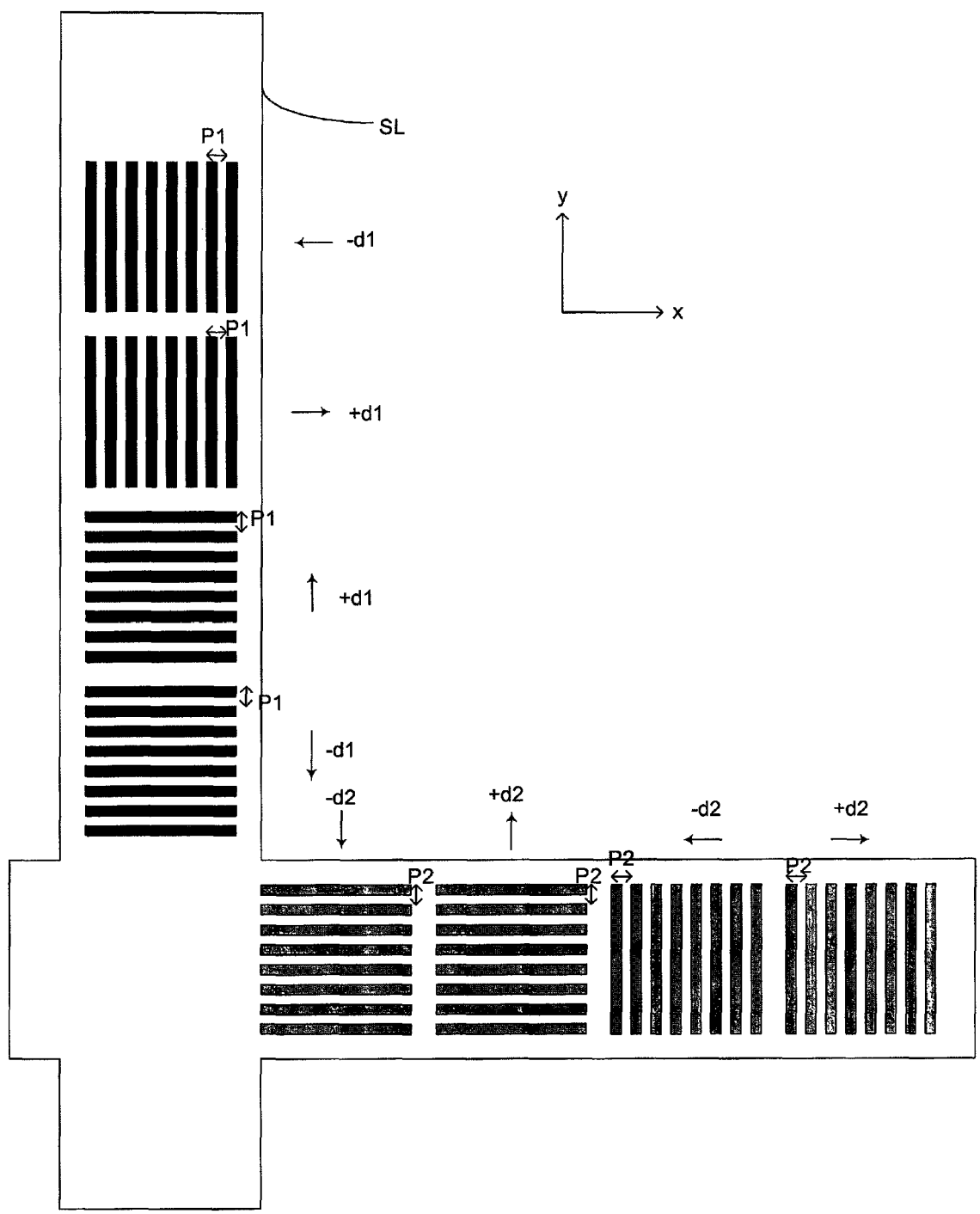
FIG. 2 depicts overlay markers according to a first embodiment of the invention.
Figure 3:
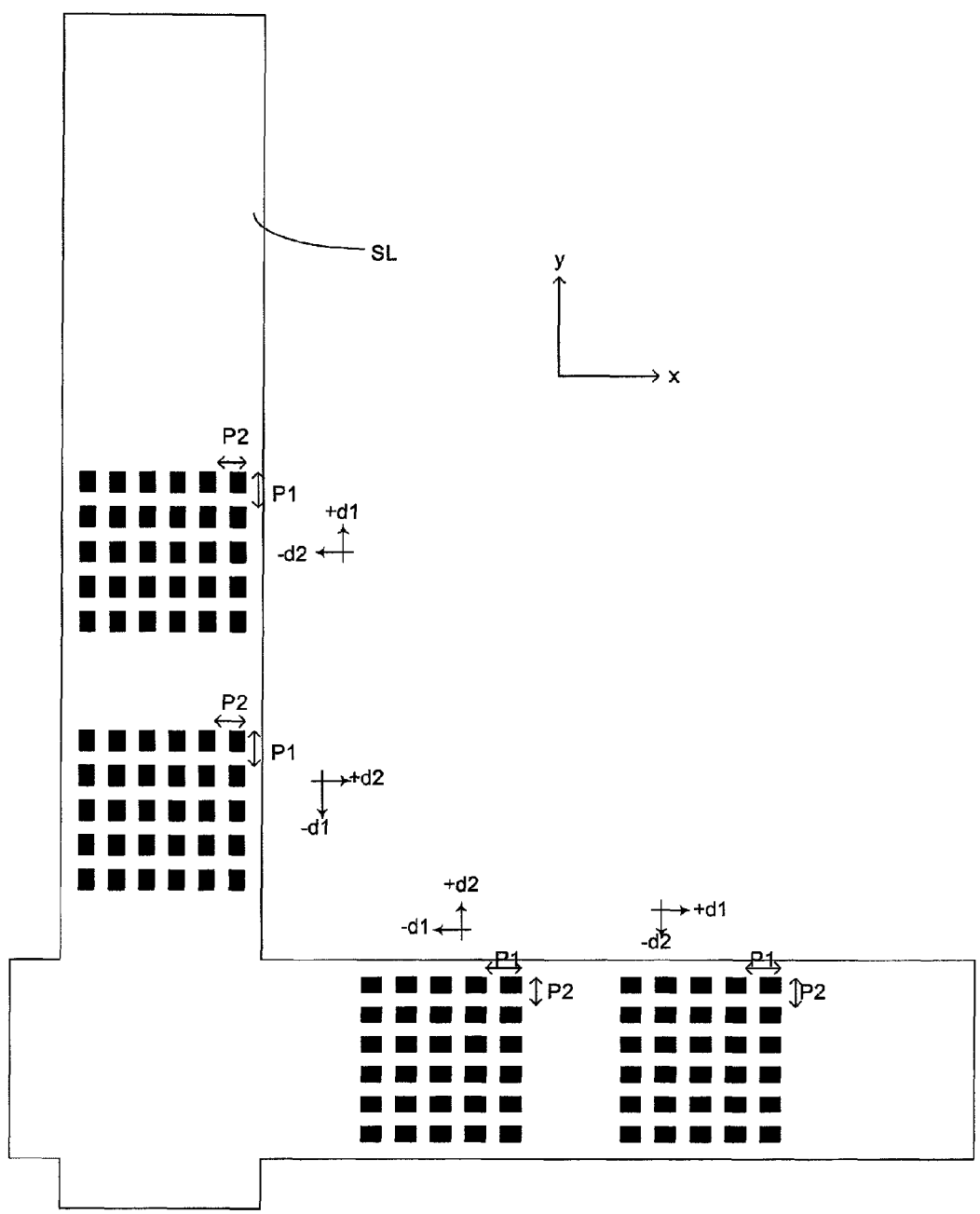
FIG. 3 depicts overlay markers according to a second embodiment of the invention.
Figure 4:
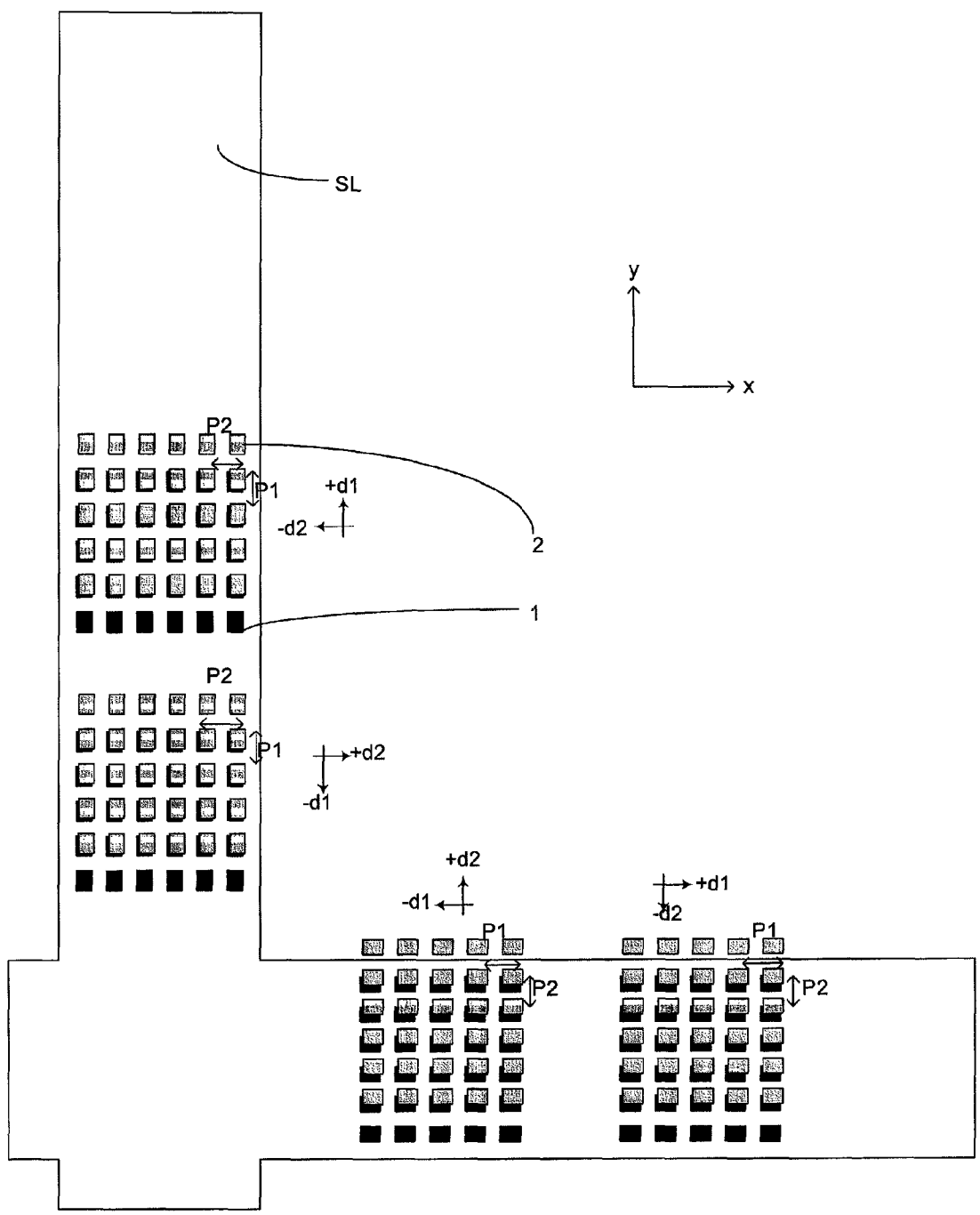
FIG. 4 depicts an example of the overlay markers according to the second embodiment in use.

In order to be able to measure misalignments of more than the pitch of the grating, the present invention may comprise an overlay mark as shown in FIGS. 2, 3 and 4.

FIG. 2 shows a scribe lane SL containing an overlay target comprising four gratings. Two of the gratings are oriented perpendicularly to the two other gratings. The gratings in the scribe lane in the y direction all have a pitch P1. The gratings in the scribe lane in the x direction all have a pitch P2. The perpendicular orientation of the different overlay gratings allows for the measurement of errors in the x and y directions. The way this is done is by superposing the same formation of gratings on top of these gratings in the scribe lanes. If the gratings are aligned, the diffraction spectrum indicates this. If the gratings are misaligned by less than P1 or P2 (i.e. the pitch of the gratings), the diffraction spectrum indicates this. If the gratings are misaligned by exactly P1 (i.e. the pitch of the gratings in the y-direction scribe lane), the diffraction spectrum from the gratings in the y-direction will show the same as if the gratings are misaligned. However, the diffraction spectrum from the gratings in the x-direction, because of the difference in pitch, will create a diffraction spectrum with evidence of a misalignment. The combination of the two diffraction spectra enables the inspection apparatus to determine by how much the gratings are misaligned; and by how many multiples of P1, thanks to the extent of the misalignment of P2.

For example, if P2 is less than P1 by ×1 and if the misalignment of the superposed grating is by a distance P1, the misalignment of the superposed grating in the x-direction will be by a distance of ×1. However, if the misalignment is by a distance 2×P1, the misalignment of the superposed grating in the x-direction will be 2×1, which will be shown by the diffraction spectrum of the gratings in the x-direction.

It is possible to determine misalignment in this way in both x and y directions with only two gratings in each of the x- and y-direction scribe lanes; as long as there are perpendicular gratings in each scribe lane direction. In the present embodiment, the reason that there are two gratings rather than a single grating in each perpendicular direction is that the gratings have a small bias (or offset) ±d1 in the y-direction and ±d2 in the x-direction, as shown in FIG. 2. +d1 and −d1 are intentional offsets of the gratings on top of the unknown overlay error. They are used to gauge the dependency of the overlay on the asymmetry of the gratings. This can be mathematically shown as:

For grating 1 with a bias −d and unknown overlay OV, $$\text{asymmetry } A(-)=K(OV-d). \quad (1)$$

For grating 2 with a bias +d and unknown overlay OV, $$\text{Asymmetry } A(+)=K(OV+d); \quad (2)$$

where K is a constant that depends on the process and target characteristics. Using these two equations, the overlay (as well as the constant K) can be determined. The magnitude of d depends on the type of target used (e.g. the pitch and duty cycle of the gratings) and the process being used (e.g. how the different layers are processed).

The value of d is small (e.g. of the order of 10 nm) because the relation of equation (1) above only holds for a limited area near OV=0.

The TIS (systematic error of the sensor) is determined by measuring the same grating a second time, rotated 180°. The overlay will also be rotated with the grating but the TIS will have the same magnitude and sign and can then be determined and removed as an error.

As discussed above, because the gratings in the x-direction scribe lane have a different periodicity from the gratings in the y-direction scribe lane (although both gratings are orientated in the same direction), a large overlay error (e.g. larger than P1 or P2) can easily be detected by comparing the two diffraction spectrum results in either the x-direction or the y-direction.

Combinations of overlay measurements in both the x- and y-orientated gratings in both the x- and y-scribe lanes give rise to the ability to detect large and small overlay measurements in directions other than x and y by vector combination. Rotations of the substrate may also be measured in the same way.

FIG. 3 shows an embodiment of the invention that takes less scribe lane space. It is desirable to take up less scribe lane space because there are many alignment, overlay, CD and other targets, as well as all sorts of test structures, which also require scribe lane space and so the economical use of scribe lane space is desired.

Instead of the bar-gratings of FIG. 2, FIG. 3 shows a target consisting of two-dimensional gratings that have a different period in the direction of the scribe lane from that in the direction perpendicular to the scribe lane. Each of the gratings furthermore has a small bias (d1 and d2) in both the x and y directions. Again, the bias is to eliminate the TIS error of the sensor as discussed above.

Because the gratings in the x-direction scribe lane have a different periodicity in the x-direction from the gratings in the y-direction scribe lane in the same direction, a large overlay error can easily be detected by comparing the two results in the x-direction in the same way as described in relation to FIG. 2, but in less scribe lane space.

The way the overlay measurement is carried out is shown in FIG. 4. The second layer 2 is printed on top of the first layer 1. As can be seen from FIG. 4, the second layer 2 has an overlay error compared to the first layer 1 which is of the order of the pitch P1 in the y-direction of the overlay target gratings in the y-direction scribe lane. There is also a slight shift in the x-direction of the second layer 2 compared to the first layer 1, which is smaller than the pitch P2. If the overlay targets in the y-direction scribe lane were taken on their own, only a very small overlay error would be determined from the diffraction spectrum recorded from this overlay target. However, because of the overlay target gratings in the x-direction scribe lane, because of the different pitch P2 in the y-direction, the diffraction spectrum will show that the error is in fact larger than measured using the P1 pitched gratings alone.

The diffraction spectra from the two directions of overlay targets can be compared with each other and with library data to determine what the overlay error is. A specific overlay value will give a specific diffraction spectrum. The spectra are therefore inspected and compared with spectra of known overlay values to give the present overlay value. The difference in spectra of the two directions also gives a relative overlay, and may be combined to give an indication of rotational overlay errors as well as linear displacements in layers.

What is claimed is:

1. A substrate comprising:
   an overlay target comprising two superposed layers, wherein each of the two superposed layers comprise:
   a first grating disposed on a first lane and having a first plurality of rectangular structures,
   a second grating disposed on a second lane having a second plurality of rectangular structures,
   the first grating having a first pitch and the second grating having a second pitch, the first pitch being different than the second pitch,
   wherein an intersection of the first and second lanes is void of gratings, and
   wherein the first and second gratings in each layer are substantially completely superposed on top of one another.

2. The substrate according to claim 1, wherein:
   the first grating comprises two sub-gratings with perpendicular orientations and the first pitch; and
   the second grating comprises two sub-gratings with perpendicular orientations and the second pitch.

3. The substrate according to claim 2, wherein:
   each of the first and second gratings comprises four sub-gratings;

a first sub-grating and a second sub-grating having a parallel orientation to each other;
a third sub-grating and a fourth sub-grating having a parallel orientation to each other and an orientation perpendicular to the first and second sub-gratings; and
first and third sub-gratings have a different offset with respect to the second and fourth ratings.

4. The substrate according to claim 3, wherein each of the first, second, third, and fourth sub-gratings has an offset.

5. The substrate according to claim 1, wherein each of the first and second gratings is a two-dimensional grating comprising a plurality of bars with a defined width and separation.

6. The substrate according to claim 1, wherein each plurality of rectangular structures has a third pitch in a first direction and a fourth pitch in a perpendicular direction.

7. The substrate according to claim 1, wherein:
each of the two superposed layers comprises two sets of arrays; and
each of the two sets of arrays comprise two arrays of rectangular structures with a first array having an offset with respect to a second array in each of the sets of arrays.

8. A substrate comprising:
an overlay target, wherein the overlay target comprises two superposed layers, wherein each of the two superposed layers comprise:
a first set of gratings disposed on a first lane in a first axis of the substrate; and
a second set of gratings disposed on a second lane in a second axis of the substrate the second axis perpendicular to the first axis,
wherein each of the first and second sets of gratings comprise an array of rectangular structures with a first pitch in a first direction and a second pitch in a second direction, the second direction perpendicular to the first direction,
wherein an intersection of the first and second lanes is void of gratings, and
wherein the first and second sets of gratings in each layer are substantially completely superposed on top of one another.

9. The substrate according to claim 8, wherein each of the first and second sets of gratings comprise a two-dimensional grating including a plurality of bars with a defined width and separation.

* * * * *